United States Patent
Brevnov

(10) Patent No.: US 11,876,231 B2
(45) Date of Patent: Jan. 16, 2024

(54) DIFFUSION BARRIER FILMS ENABLING THE STABILITY OF LITHIUM

(71) Applicant: Applied Materials, Inc., Santa Clara, CA (US)

(72) Inventor: Dmitri A. Brevnov, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 608 days.

(21) Appl. No.: 17/059,573

(22) PCT Filed: Jun. 18, 2019

(86) PCT No.: PCT/US2019/037728
§ 371 (c)(1),
(2) Date: Nov. 30, 2020

(87) PCT Pub. No.: WO2019/246095
PCT Pub. Date: Dec. 26, 2019

(65) Prior Publication Data
US 2021/0218032 A1 Jul. 15, 2021

Related U.S. Application Data

(60) Provisional application No. 62/688,351, filed on Jun. 21, 2018.

(51) Int. Cl.
*H01M 4/66* (2006.01)
*C23C 14/06* (2006.01)
(Continued)

(52) U.S. Cl.
CPC ......... *H01M 4/667* (2013.01); *C23C 14/0641* (2013.01); *C23C 14/165* (2013.01);
(Continued)

(58) Field of Classification Search
CPC .. H01M 4/667; H01M 4/0404; H01M 4/0426; H01M 4/405; H01M 4/134;
(Continued)

(56) References Cited

U.S. PATENT DOCUMENTS

| | | |
|---|---|---|
| 6,413,285 B1 | 7/2002 | Chu et al. |
| 6,844,113 B2 | 1/2005 | Yagi et al. |

(Continued)

FOREIGN PATENT DOCUMENTS

| | | |
|---|---|---|
| CN | 107154499 | 9/2017 |
| GB | 2252981 A | 8/1992 |

(Continued)

OTHER PUBLICATIONS

Extended European Search Report dated Feb. 10, 2022 for Application No. EP19822456.

(Continued)

*Primary Examiner* — Gary D Harris
(74) *Attorney, Agent, or Firm* — Patterson + Sheridan, LLP

(57) ABSTRACT

Lithium-containing anodes, high performance electrochemical devices, such as secondary batteries, including the aforementioned lithium-containing electrodes, and methods for fabricating the same are provided. In one implementation, an anode electrode is provided. The anode electrode comprises a first diffusion barrier layer formed on a copper foil. The first diffusion barrier layer comprises titanium (Ti), molybdenum (Mo), tungsten (W), zirconium (Zr), hafnium (H), niobium (Nb), tantalum (Ta), or combinations thereof. The anode electrode further comprises a wetting layer formed on the first diffusion barrier layer. The wetting layer is selected from silicon (Si), tin (Sn), aluminum (Al), germanium (Ge), antimony (Sb), lead (Pb), bismuth (Bi), gallium (Ga), indium (In), zinc (Zn), cadmium (Cd), magnesium (Mg), (Continued)

oxides thereof, nitrides thereof, or combinations thereof. The anode electrode further comprises a lithium metal layer formed on the wetting layer.

20 Claims, 5 Drawing Sheets

(51) Int. Cl.
*C23C 14/16* (2006.01)
*C23C 14/34* (2006.01)
*C23C 14/56* (2006.01)
*C23C 28/00* (2006.01)
*H01M 4/04* (2006.01)
*H01M 4/40* (2006.01)

(52) U.S. Cl.
CPC ............ *C23C 14/34* (2013.01); *C23C 14/562* (2013.01); *C23C 28/34* (2013.01); *H01M 4/0404* (2013.01); *H01M 4/0426* (2013.01); *H01M 4/405* (2013.01)

(58) Field of Classification Search
CPC .. H01M 4/1395; H01M 4/661; H01M 10/052; C23C 14/0641; C23C 14/165; C23C 14/34; C23C 14/562; C23C 28/34; C23C 14/024; Y02E 60/10
USPC .................................................... 429/231.95
See application file for complete search history.

(56) References Cited

U.S. PATENT DOCUMENTS

| | | |
|---|---|---|
| 2002/0187398 A1 | 12/2002 | Mikhaylik et al. |
| 2009/0311591 A1 | 12/2009 | Snyder et al. |
| 2012/0070746 A1 | 3/2012 | Mikhaylik et al. |
| 2017/0200975 A1 | 7/2017 | Liao et al. |

FOREIGN PATENT DOCUMENTS

| | | | |
|---|---|---|---|
| JP | H08130005 A | * | 10/1994 |
| JP | 2002373644 A | | 12/2002 |
| JP | 2006059714 A | | 3/2006 |
| JP | 2010262752 A | | 11/2010 |
| JP | 2014084272 A | | 5/2014 |
| KR | 20050038905 A | | 4/2005 |
| KR | 20120032044 A | | 4/2012 |
| WO | 2014156638 A1 | | 10/2014 |
| WO | 2017131997 A1 | | 8/2017 |
| WO | 2018005038 A1 | | 1/2018 |

OTHER PUBLICATIONS

International Search Report and Written Opinion for Application No. PCT/US2019/037728 dated Oct. 11, 2019.
Japanese Office Action dated Sep. 12, 2023 for Application No. 2020-570431.
Korean Office Action dated Oct. 8, 2021 for Application No. 10-2020-7011471.
Japanese Office Action dated Apr. 11, 2023 for Application No. 2020-570431.

* cited by examiner

DIFFUSION BARRIER FILMS ENABLING THE STABILITY OF LITHIUM

BACKGROUND

Implementations described herein generally relate to metal electrodes, more specifically lithium-containing anodes, high performance electrochemical devices, such as secondary batteries, including the aforementioned lithium-containing electrodes, and methods for fabricating the same.

DESCRIPTION OF THE RELATED ART

Rechargeable electrochemical storage systems are currently becoming increasingly important for many fields of everyday life. High-capacity electrochemical energy storage devices, such as lithium-ion (Li-ion) batteries, are used in a growing number of applications, including portable electronics, medical, transportation, grid-connected large energy storage, renewable energy storage, and uninterruptible power supply (UPS). Traditional lead/sulfuric acid batteries often lack the capacitance and are often inadequately cyclable for these growing applications. Lithium-ion batteries, however, are thought to have the best chance.

Typically, lithium-ion batteries do not contain any metallic lithium for safety reasons but instead use a graphitic material as the anode. However, the use of graphite, which, in the charged state can be charged up to the limit composition LiCe, results in a much lower capacitance, in comparison with the use of metallic lithium. Currently, the industry is moving away from graphitic-based anodes to silicon-blended graphite to increase energy cell density. However, silicon blended graphite anodes suffer from first cycle capacity loss. Thus, there is a need for lithium metal deposition to replenish first cycle capacity loss of silicon blended graphite anodes. However, lithium metal faces several device integration challenges. For example, deposition of lithium on copper substrates can lead to lithium-induced embrittlement of the copper substrate.

Therefore, there is a need for methods and systems for the deposition and processing of lithium metals in energy storage systems.

SUMMARY

Implementations described herein generally relate to metal electrodes, more specifically lithium-containing anodes, high performance electrochemical devices, such as secondary batteries, including the aforementioned lithium-containing electrodes, and methods for fabricating the same. In one implementation, an anode electrode is provided. The anode electrode comprises a copper foil. The anode electrode further comprises a first diffusion barrier layer formed on the copper foil. The first diffusion barrier layer comprises titanium (Ti), molybdenum (Mo), tungsten (W), zirconium (Zr), hafnium (Hf), niobium (Nb), tantalum (Ta), or combinations thereof. The anode electrode further comprises a wetting layer formed on the first diffusion barrier layer. The wetting layer is selected from silicon (Si), tin (Sn), aluminum (Al), germanium (Ge), antimony (Sb), lead (Pb), bismuth (Bi), gallium (Ga), indium (In), zinc (Zn), cadmium (Cd), magnesium (Mg), oxides thereof, nitrides thereof, or combinations thereof. The anode electrode further comprises a lithium metal layer formed on the wetting layer.

In another implementation, a method of forming an electrode structure is provided. The method comprises forming a first diffusion barrier layer on a copper foil. The first diffusion barrier layer comprises titanium (Ti), molybdenum (Mo), tungsten (W), zirconium (Zr), hafnium (Hf), niobium (Nb), tantalum (Ta), or combinations thereof. The method further comprises forming a wetting layer on the first diffusion barrier layer. The wetting layer is selected from silicon (Si), tin (Sn), aluminum (Al), germanium (Ge), antimony (Sb), lead (Pb), bismuth (Bi), gallium (Ga), indium (In), zinc (Zn), cadmium (Cd), magnesium (Mg), oxides thereof, nitrides thereof, or combinations thereof. The method further comprises forming a lithium metal layer on the wetting layer.

In yet another implementation, an integrated processing tool operable to form lithium coated negative electrodes is provided. The integrated processing tool comprises a reel-to-reel system operable to transport a continuous sheet of material through a series of processing chambers. The series of processing chamber further includes a first processing chamber operable to deposit a first diffusion barrier layer on the continuous sheet of material. The series of processing chamber further includes a second processing chamber operable to deposit a second diffusion barrier layer on the first diffusion barrier layer. The series of processing chamber further includes a third processing chamber operable to deposit a wetting layer on the second diffusion barrier layer. The series of processing chamber further includes a fourth processing chamber operable to deposit a thin film of lithium metal on the second diffusion barrier layer.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
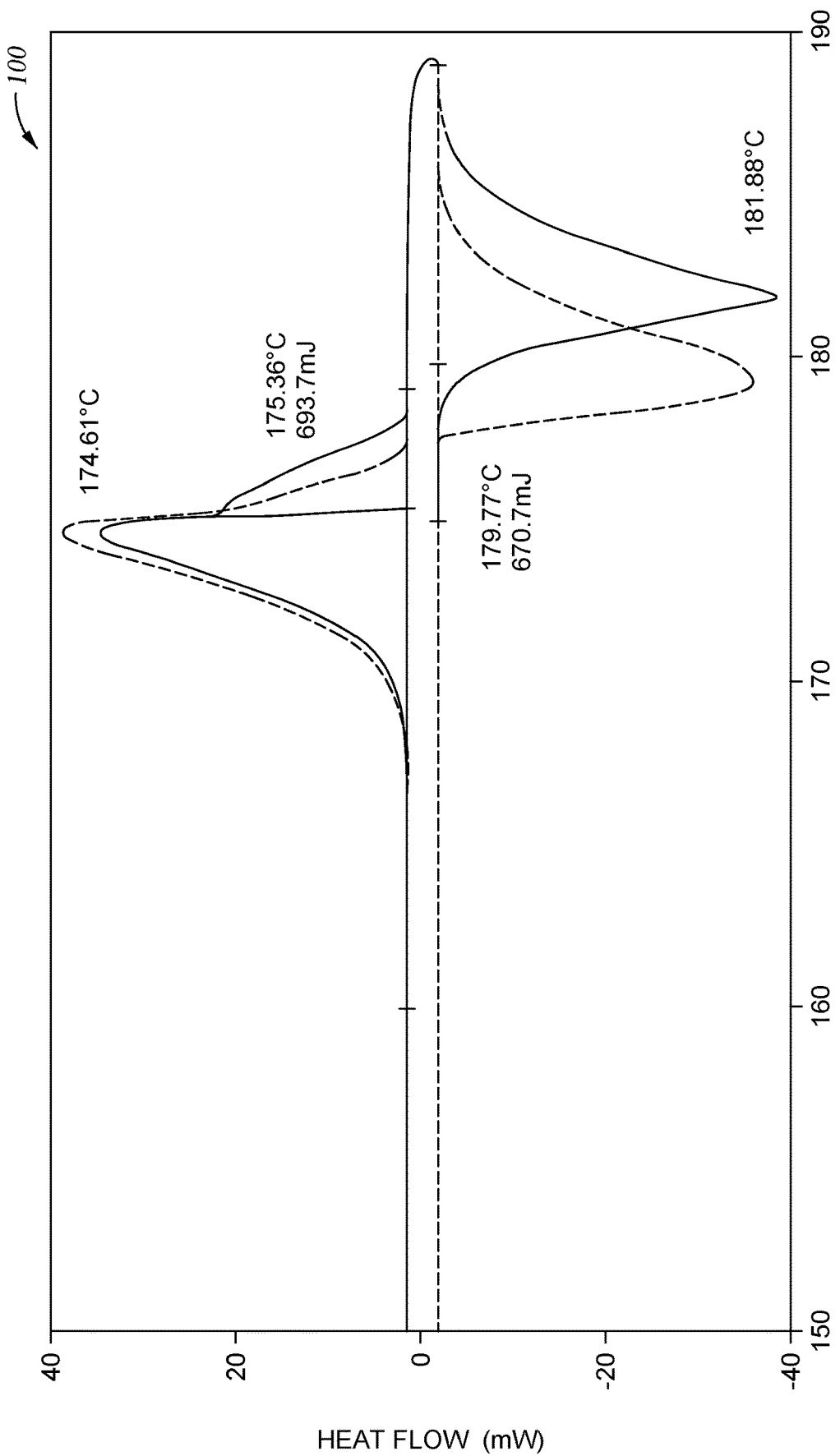
FIG. 1 illustrates a plot demonstrating lithium melting point depression.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes anode electrodes, high performance electrochemical cells and batteries including the aforementioned anode electrodes, and methods for fabricating the same. Certain details are set forth in the following description and in FIGS. 1-5 to provide a thorough understanding of various implementations of the disclosure. Other details describing well-known structures and systems often associated with electrochemical cells and batteries are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a roll-to-roll coating system, such as TopMet™, SMARTWEB®, TopBeam™ all of which are available from Applied Materials, Inc. of Santa Clara, California Other tools capable of performing physical vapor deposition processes (e.g., high rate evaporation processes and magnetron sputtering processes) may also be adapted to benefit from the implementations described herein. In addition, any system enabling the physical vapor deposition processes described herein can be used to advantage. The apparatus description described herein is illustrative and should not be construed or interpreted as limiting the scope of the implementations described herein. It should also be understood that although described as a roll-to-roll process, the implementations described herein may also be performed on discrete substrates.

FIG. 1 illustrates a plot 100 demonstrating lithium melting point depression from the first heating cycle to the second heating cycle. The thermal stability of lithium metal/copper foil samples fabricated with the state-of-the art process was examined by means of Differential Scanning Calorimetry (DSC) as shown in FIG. 1. 200-μm thick FMC lithium foil was laminated on and encapsulated with 2 pieces of 12 μm thick Oak-Mitsui™ Copper foil. The first heating cycle shows the lithium onset melting point of 179.77 degrees Celsius and peak melting point of 181.88 degrees Celsius. In contrast, the second heating cycle shows the lithium melting points of 177.58 degrees Celsius and 179.26 degrees Celsius, respectively. The depression of Lithium melting point indicates that the impurity (e.g., copper) is incorporated in lithium during lithium heating/melting. Thus, the lithium metal/copper foil interface is not stable upon lithium melting. In addition, literature has shown that lithium accumulation in copper foil current collectors can be measured. Thus, the experimental data validates the necessity of a barrier film between lithium film and copper foil current collector, especially during elevated temperature manufacturing/storage.

The temporal/thermal stability of the lithium metal/copper foil current collector interface is critical for operation of lithium metal batteries. State of the art technology includes either direct lamination of lithium foils or PVD (e.g., evaporation) of lithium onto copper foil. State of the art copper foils are treated to produce passivation-based chromate/zincate films. These passivation-based films are intended to improve anticorrosion properties resulting in increased shelf life, in comparison to untreated copper foils. However, experience with lithium metal/copper foils demonstrates that the barrier performance of these passivation-based films is insufficient to ensure the stability of the lithium metal/copper foil interface. As a result, lithium diffuses into copper grain boundaries, which leads to lithium-induced embrittlement of copper current collectors. In addition, copper incorporation in lithium prevents lithium-phase purity and crystallization control (See FIG. 1). As a result, the cycle life of lithium metal anode decreases. In some implementations of the present disclosure, deposition of the barrier films described herein between lithium film/copper foils addresses the aforementioned issues.

In some implementations of the present disclosure, refractory metal diffusion barrier films are deposited on copper foils to prevent/minimize undesirable inter-diffusion process, which results in the interface deterioration during the lithium metal anode manufacturing and battery operation/storage. The deposition of refractory metal/metal nitride barrier films described herein ensures the temporal/thermal stability of the lithium metal/copper foil current collectors interface. As a result, lithium film/copper foil does not suffer degradation during operation as anodes in lithium metal batteries. In addition, the barrier films described herein prevent the lithium-induced embrittlement of copper foils, preserve mechanical properties and minimize foil tearing. Thus, the barrier films described herein facilitate copper foil roll-to-roll handling.

Figure 2:
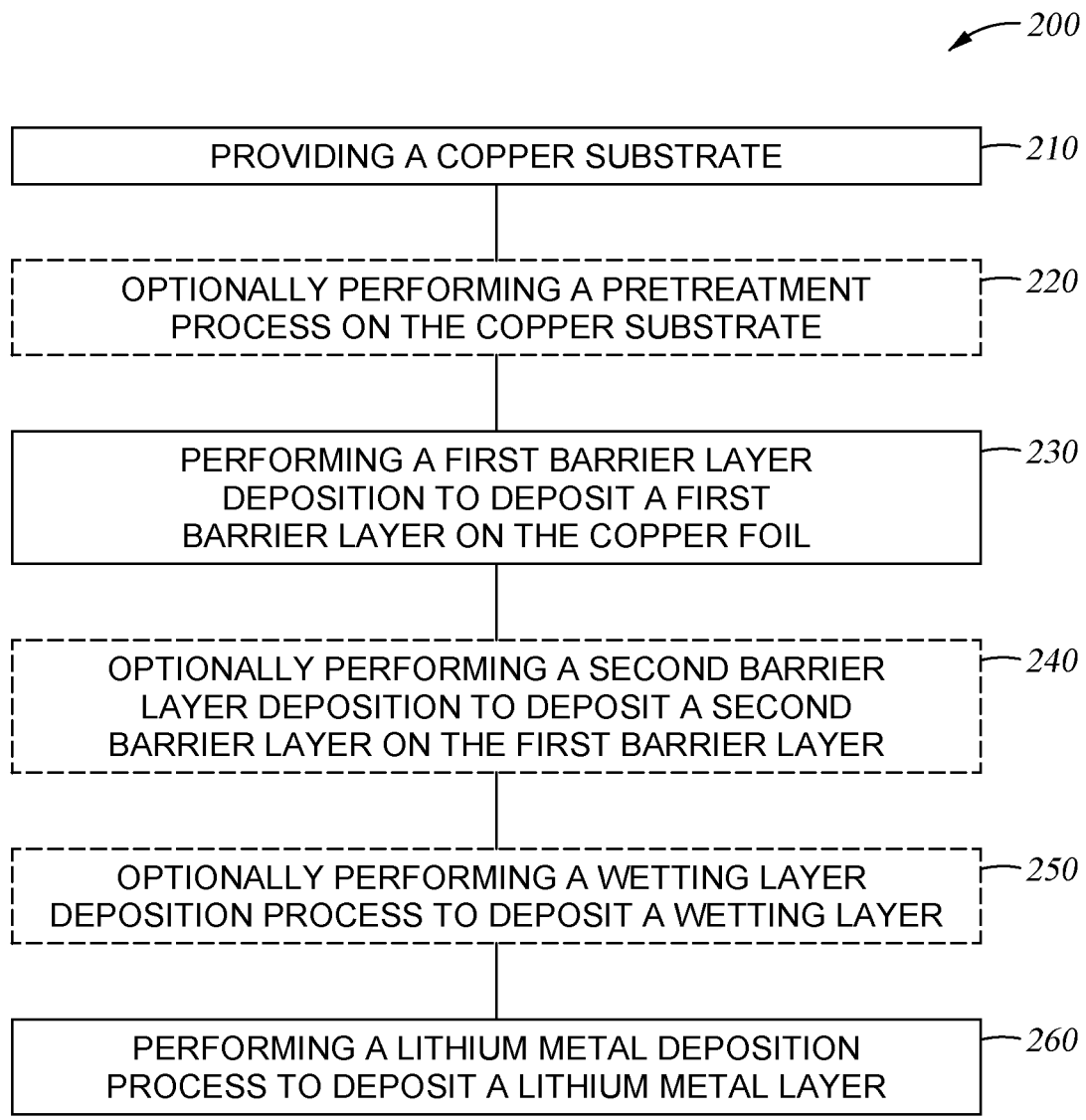
FIG. 2 illustrates a process flow chart summarizing one implementation of a method of forming an anode electrode structure according to implementations described herein.

FIG. 2 illustrates a process flow chart summarizing one implementation of a processing sequence 200 of forming an anode electrode structure according to implementations described herein. The processing sequence 200 described in FIG. 2 corresponds to the fabrication stages depicted in FIGS. 3A-3D, which are discussed below. FIGS. 3A-3D illustrate cross-sectional views of an anode electrode structure 300 at various stages of fabrication according to implementations described herein. Although anode electrode structure 300 is a dual sided electrode structure, the implementations described herein are also applicable to single sided electrode structures.

The processing sequence 200 begins at operation 210 by providing a copper substrate 310. In one implementation, the copper substrate 310 comprises a slab, foil or sheet of copper. The copper substrate 310 may have a thickness from about 0.5 μm to about 20 μm (e.g., from about 1 μm to about 10 μm; or from about 5 μm to about 10 μm.) The copper substrate 310 may have any shape, such as square, circular, oval, oblong, etc. In some implementations, the copper substrate 310 may be square or rectangular, or a sheet of x-by-y square or rectangular units, or an x-unit wide roll, wherein each unit represents an individual, separable substrate for a single electrode structure. In one implementation, the copper substrate 310 comprises a sheet of copper stored on a roll and used in a roll-to-roll tool, for example, the roll-to-roll toll shown in FIG. 5.

Optionally, at operation 210, the copper substrate is exposed to a pretreatment process. The pretreatment process is generally a pre-clean process performed prior to deposition of a first diffusion barrier layer at operation 210. The pre-clean process may remove, for example, residue from processing the stock from which the copper substrate 310 is prepared, residual organic material, particles and/or other contaminants that may adversely affect the adhesion of the first diffusion barrier layer 320a, 320b (collectively 320) to the surface of the copper substrate 310. Pre-cleaning the copper substrate 310 may comprise wet cleaning and/or dry cleaning.

Suitable etching techniques for the pre-lean process may include wet etching processes (e.g., wet chemical etching), or dry etching (e.g., reactive ion etching or sputter etching). In one implementation, the copper substrate 310 is cleaned by immersing the substrate in and/or rinsing the substrate with a liquid-phase cleaner (e.g., that removes organic residue), followed by wet etching using a dilute aqueous acid (e.g., dilute aqueous HF, which may be buffered with ammonia and/or ammonium fluoride). Alternative acids for use in wet etching the copper substrate 310 include nitric acid, sulfuric acid, hydrochloric acid, etc., depending on the grade of copper used and the temperature that the copper substrate 310 is processed. In another implementation, the copper substrate 310 is cleaned by sputter etching. The selection of gas(es) for use in a dry etching process to clean the copper substrate 310 is not particularly limited. Any gas or combination of gases that removes substantially all undesired contaminants from the surface of the copper substrate 310, but does not leave a permanent residue, may be employed. For example, an inert gas such as argon may be employed in sputter cleaning of the copper substrate 310.

In one implementation, the pre-clean process of operation 220 comprises annealing the copper substrate 310 in a forming gas ($H_2/N_2$) environment. In another implementation, the pre-clean process of operation 220 comprises annealing the copper substrate 310 in a hydrogen and argon-containing ($H_2/Ar$) environment. In one implementation, the processing temperature during the pre-clean process of operation 220 is between about 50 degrees Celsius and about 150 degrees Celsius (e.g., between about 80 degrees Celsius and about 150 degrees Celsius; or between about 100 degrees Celsius and about 150 degrees Celsius). In one implementation, the pre-clean process of operation 220 comprises passing and pressing the copper substrate 310 between rollers in order to decrease roughness of the copper substrate 310.

Figure 3A:
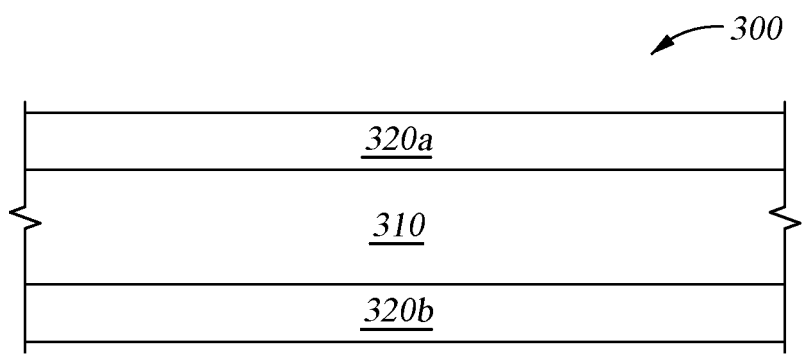
FIGS. 3A-3D illustrate cross-sectional views of an electrode structure at various stages of fabrication according to implementations described herein.

Referring now to FIG. 3A, at operation 230, a first diffusion barrier layer deposition process is performed to deposit a first diffusion barrier layer 320a, 320b (collectively 320) on the copper substrate 310. The first diffusion barrier layer 320 functions as the copper diffusion barrier. The first diffusion barrier layer 320 generally contains a refractory metal and/or a refractory metal nitride. In one implementation, the refractory metal is selected from molybdenum (Mo), tungsten (W), tantalum (Ta), niobium (Nb), titanium (Ti) or combinations thereof. In one implementation, the refractory metal nitride is selected from titanium nitride (TiN), tungsten nitride (WN), tantalum nitride, or combinations thereof. In one implementation, the first diffusion barrier layer 320 is a tantalum layer. In another implementation, the first diffusion barrier layer 320 is a tantalum nitride layer. The first diffusion barrier layer 320 may have a thickness within a range from about 2 Å to about 500 Å, more narrowly within a range from about 5 Å to about 100 Å, more narrowly within a range from about 3 Å to about 80 Å, more narrowly within a range from about 4 Å to about 50 Å, more narrowly within a range from about 5 Å to about 25 Å, more narrowly within a range from about 5 Å to about 20 Å, more narrowly within a range from about 5 Å to about 15 Å, and more narrowly within a range from about 5 Å to about 10 Å. The first diffusion barrier layer 320 is generally deposited by atomic layer deposition (ALD), plasma-enhanced ALD (PE-ALD), chemical vapor deposition (CVD), or physical vapor deposition (PVD) processes. In one implementation, operation 230 is a PVD process performed by a DC magnetron sputtering process. In one implementation, the DC magnetron sputtering process is performed at room temperature. In one implementation of the PVD process, the base pressure is $10^7$ mbar, the process temperature is in a range between room temperature and 100 degrees Celsius with a target DC power in a range from about 2 to about 10 kW.

In one implementation, the first diffusion barrier layer 320 is a tantalum layer deposited by a PVD sputtering process using a tantalum target. In another implementation, the first diffusion barrier layer 320 is a tantalum nitride layer deposited by a PVD sputtering process using a tantalum target in a nitrogen-containing environment or using a tantalum nitride target.

Figure 3B:
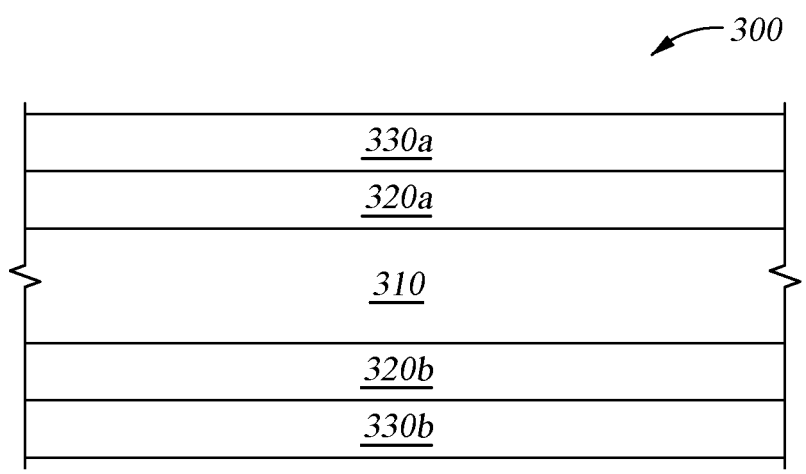

Referring now to FIG. 3B, optionally, at operation 240, a second diffusion barrier layer 330 deposition process is performed to deposit a second diffusion barrier layer 330 on the first diffusion barrier layer 320 to form a dual-barrier layer. The second diffusion barrier layer 330 functions as the lithium diffusion barrier. The second diffusion barrier layer 330 generally contains a refractory metal and/or a refractory metal nitride. The refractory metal and/or the refractory metal nitride of the second diffusion barrier layer 330 is different than the refractory metal and/or the refractory metal nitride of the first diffusion barrier layer 320. In one implementation, the refractory metal is selected from molybdenum (Mo), tungsten (W), tantalum (Ta), niobium (Nb), titanium (Ti) or combinations thereof. In one implementation, the refractory metal nitride is selected from titanium nitride (TiN), tungsten nitride (WN), tantalum nitride, or combinations thereof. In one implementation, the second diffusion barrier layer 330 is a titanium layer. In another implementation, the second diffusion barrier layer 330 is a titanium nitride layer. The second diffusion barrier layer 330 may have a thickness within a range from about 2 Å to about 100 Å, more narrowly within a range from about 3 Å to about 80 Å, more narrowly within a range from about 4 Å to about 50 Å, more narrowly within a range from about 5 Å to about 25 Å, more narrowly within a range from about 5 Å to about 20 Å, more narrowly within a range from about 5 Å to about 15 Å, and more narrowly within a range from about 5 Å to about 10 Å. The second diffusion barrier layer 330 is generally deposited by atomic layer deposition (ALD), plasma-enhanced ALD (PE-ALD), chemical vapor deposition (CVD), or physical vapor deposition (PVD) processes. In one implementation, operation 240 is a PVD process performed by a DC magnetron sputtering process performed at room temperature. In one implementation of the PVD process, the base pressure is $10^7$ mbar, the process temperature is in a range between room temperature and 100 degrees Celsius with a target DC power in a range from about 2 to about 10 kW.

In one implementation, the second diffusion barrier layer 330 is a titanium layer deposited by a PVD sputtering process using a titanium target. In another implementation, the second diffusion barrier layer 330 is a titanium nitride layer deposited by a PVD sputtering process using a titanium target in a nitrogen-containing environment or using a titanium nitride target.

Figure 3C:
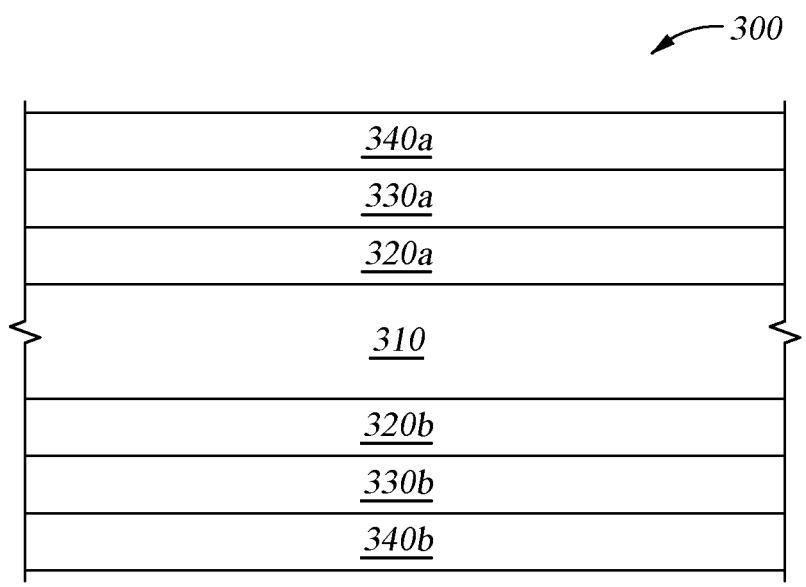

Referring now to FIG. 3C, optionally, at operation 250, a wetting layer deposition process is performed to deposit a wetting layer 340a, 340b (collectively 340) on the underlying first diffusion barrier layer 320 or the underlying second diffusion barrier layer 330 (if present). The wetting layer 340 generally enhances the adherence of the lithium metal layer 350a, 350b (collectively 350) to the underlying barrier material. The wetting layer 340 generally contains a lithium-alloying element or compound. In one implementation, the wetting layer 340 can be made of material that can bond directly with lithium or have a high contact angle. For example, Si, Sn, Al all form alloys with lithium and oxides (e.g., $SiO_x$, $SnO_x$ and $AlO_x$ (x vary from 0 to a number to match highest oxidation state for charge balance)). In one implementation, the wetting layer 340 is composed of a material selected from the group of silicon (Si), tin (Sn), aluminum (Al), germanium (Ge), antimony (Sb), lead (Pb), bismuth (Bi), gallium (Ga), indium (In), zinc (Zn), cadmium (Cd), magnesium (Mg), carbon (C), oxides thereof, nitrides thereof, or combinations thereof. In one implementation, the wetting layer 340 is composes of a material selected from the group of silicon (Si), tin (Sn), aluminum (Al), silicon oxide, tin oxide, or combinations thereof. In one implementation, the wetting layer 340 has a thickness from about 1 nm to about 200 nm (e.g., from about 5 nm to about 50 nm; from about 5 nm to about 20 nm; or from about 5 nm to about 10 nm). In one implementation, the wetting layer 340 is a silicon or silicon-containing film.

Figure 3D:
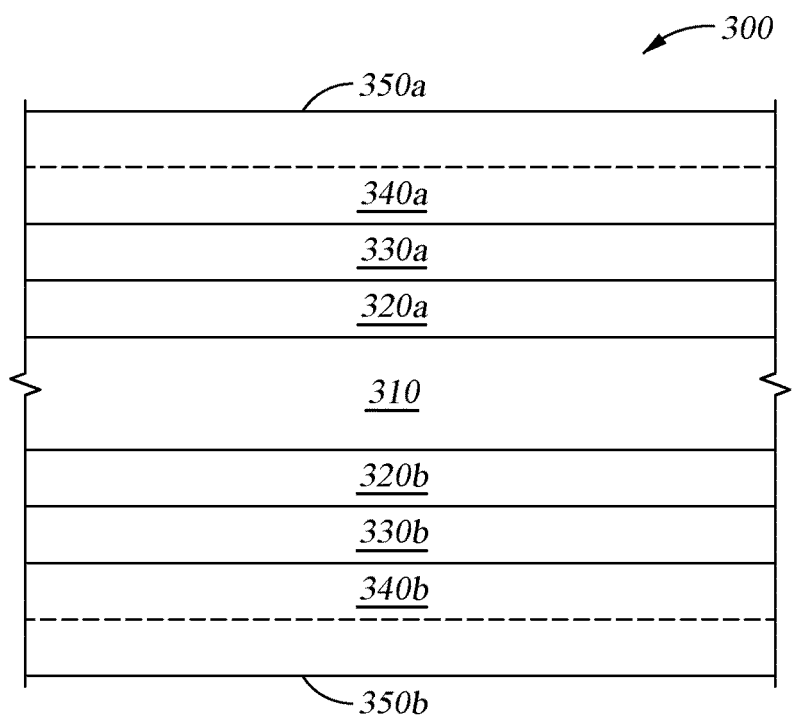

Referring now to FIG. 3D, at operation 260, a lithium metal layer deposition process is performed to deposit the lithium metal layer 350 on the underlying barrier layer or wetting layer 340 (if present) to form the anode electrode structure 300. In some implementations where the optional wetting layer 340 is present, the lithium metal layer 350 is formed on the wetting layer 340. In some implementations, the lithium metal layer 350 is formed directly on the underlying first diffusion barrier layer 320 or the underlying second diffusion barrier layer 330 (if present). The lithium metal layer 350 may be constructed from a lithium metal, lithium metal foil or a lithium alloy foil (e.g. lithium aluminum alloys), or a mixture of a lithium metal and/or lithium alloy and materials such as carbon (e.g. coke, graphite), nickel, copper, tin, indium, silicon, oxides thereof, or combinations thereof. In one implementation, the lithium metal layer 350 is a lithium metal alloy layer that forms an alloy with the underlying wetting layer 340 (if present). In one implementation, the lithium metal layer 350 typically comprises intercalation compounds containing lithium or insertion compounds containing lithium. In one implementation, the lithium metal layer 350 may be deposited using printing methods. In one implementation, the lithium metal layer 350 is laminated to the underlying structure to form the anode electrode structure 300. In one implementation, the lithium metal layer 350 is a lithium foil, which is laminated to the underlying structure, which includes barrier film(s) formed on a copper foil by passing the lithium foil and the underlying structure between two rollers. In some implementations, the lithium metal layer 350 may be formed by physical or chemical thin-film techniques, such as sputtering, electron beam evaporation, thermal evaporation, chemical vapor deposition (CVD), three-dimensional printing etc. In one implementation, the lithium metal layer 350 has a thickness from about 1 μm to about 50 μm (e.g., from about 3 μm to about 40 μm; from about 3 μm to about 20 μm; or from about 20 μm to about 40 μm).

In some implementations, the formed anode electrode structure 300 is exposed to additional processing such as deposition of a protective film on the anode electrode structure.

Figure 4:
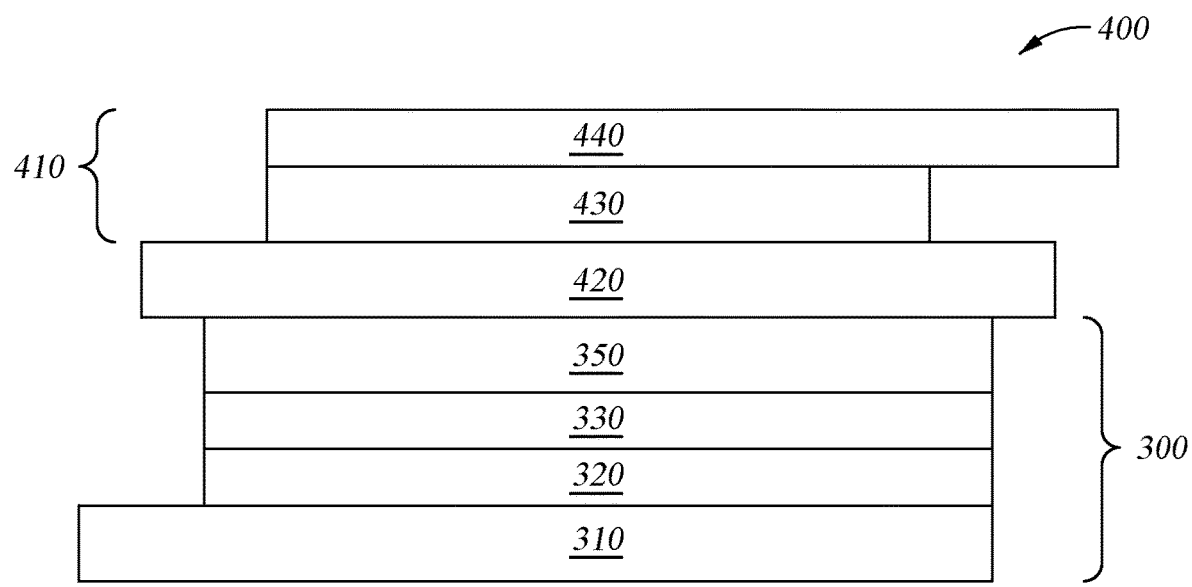
FIG. 4 illustrates a cross-sectional view of one implementation of a battery structure having an electrode structure formed according to implementations described herein.

FIG. 4 illustrates a cross-sectional view of one implementation of a battery structure 400 having the anode electrode structure 300 formed according to implementations described herein. In some implementations, the battery structure 400 is a rechargeable battery cell. In some implementations, the battery structure 400 is a capacitor (e.g., supercapacitor or ultracapacitor). In some implementations, the battery structure 400 is a solid-state battery structure. In some implementations, the battery structure 400 is combined with other cells to form a rechargeable battery or capacitor. The battery structure 400 includes a cathode electrode structure 410 and the anode electrode structure 300 separated by a separator film 420. The cathode electrode structure 410 includes a cathode current collector 440 and a cathode film 430 formed thereon. Note in FIG. 4 that the current collectors and separator film are shown to extend beyond the stack, although it is not necessary for the current collectors and/or separator film to extend beyond the stack, the portions extending beyond the stack may be used as tabs.

The cathode current collector 440 may be comprised of aluminum (Al), copper (Cu), zinc (Zn), nickel (Ni), cobalt (Co), tin (Sn), silicon (Si), manganese (Mn), magnesium (Mg), clad materials, alloys thereof, or combinations thereof. In one implementation, the cathode current collector 440 is aluminum. In one implementation, the cathode current collector 440 is perforated. Furthermore, current collectors may be of any form factor (e.g., metallic foil, sheet, or plate), shape and micro/macro structure. Generally, in prismatic cells, tabs are formed of the same material as the current collector and may be formed during fabrication of the stack, or added later. In some implementations, all components except the copper substrate 310 and the cathode current collector 440 contain lithium ion electrolytes. In one implementation, the cathode current collector 440 is aluminum. In one implementation, the cathode current collector 440 has a thickness from about 2 μm to about 20 μm.

The cathode film 430 or cathode may be any material compatible with the anode and may include an intercalation compound, an insertion compound, or an electrochemically active polymer. Suitable intercalation materials include, for example, lithium-containing metal oxides, $MoS_2$, $FeS_2$, $MnO_2$, $TiS_2$, $NbSe_3$, $LiCoO_2$, $LiNiO_2$, $LiMnO_2$, $LiMn_2O_4$, $V_6O_{13}$ and $V_2O$. Suitable polymers include, for example, polyacetylene, polypyrrole, polyaniline, and polythiophene. The cathode film 430 or cathode may be made from a layered oxide, such as lithium cobalt oxide, an olivine, such as lithium iron phosphate, or a spinel, such as lithium manganese oxide. Exemplary lithium-containing oxides may be layered, such as lithium cobalt oxide ($LiCoO_2$), or mixed metal oxides, such as $LiNi_xCo_{1-2x}MnO_2$, LiNiMn$CoO_2$ ("NMC"), $LiNi_{0.5}Mn_{1.5}O_4$, $Li(Ni_{0.8}Co_{0.15}Al_{0.05})_2$, $LiMn_2O_4$, and doped lithium rich layered-layered materials, wherein x is zero or a non-zero number. Exemplary phosphates may be iron olivine ($LiFeP_4$) and it is variants (such as $LiFe_{(1-x)}Mg_xPO_4$), $LiMoPO_4$, $LiCoPO_4$, $LiNiPO_4$, $Li_3V_2(PO_4)_3$, $LiVOPO_4$, $LiMP_2O_7$, or $LiFe_{1.5}P_2O_7$, wherein x is zero or a non-zero number. Exemplary fluorophosphates may be $LiVPO_4F$, $LiAlPO_4F$, $Li_5V(PO_4)_2F_2$, $Li_5Cr(PO_4)_2F_2$, $Li_2CoPO_4F$, or $Li_2NiPO_4F$. Exemplary silicates may be $Li_2FeSiO_4$, $Li_2MnSiO_4$, or $Li_2VOSiO_4$. An exemplary non-lithium compound is $Na_5V_2(PO_4)_2F_3$. The cathode film 430 may be formed by physical or chemical thin-film techniques, such as sputtering, electron beam evaporation, chemical vapor deposition (CVD), etc. In one implementation, the cathode film 430 has a thickness from about 10 μm to about 100 μm (e.g., from about 30 μm to about 80 μm; or from about 40 μm to about 60 μm). In one implementation, the cathode film 430 is a $LiCoO_2$ film. In some implementations, where the energy storage device is an electrochemical capacitor, high-surface area carbon is used as an electrode.

Electrolytes infused in cell components 320, 330, 350, 420 and 430 can be comprised of a liquid/gel or a solid polymer and may be different in each. In some implementations, the electrolyte primarily includes a salt and a medium (e.g., in a liquid electrolyte, the medium may be referred to as a solvent; in a gel electrolyte, the medium may be a polymer matrix). The salt may be a lithium salt. The lithium salt may include, for example, $LiPF_6$, $LiAsF_6$, $LiCF_3SO_3$, $LiN(CF_3SO_3)_3$, $LiBF_6$, and $LiClO_4$, lithium bis (trifluoromethane)sulfonimidate (e.g., LiTFSI), BETTE electrolyte (commercially available from 3M Corp. of Minneapolis, MN) or combinations thereof. Solvents may include, for example, ethylene carbonate (EC), propylene carbonate (PC), EC/PC, 2-MeTHF(2-methyltetrahydrofuran)/EC/PC, EC/DMC (dimethyl carbonate), EC/DME (dimethyl ethane), EC/DEC (diethyl carbonate), EC/EMC (ethyl methyl carbonate), EC/EMC/DMC/DEC, EC/EMC/DMC/DEC/PE, PC/DME, and DME/PC. Polymer matrices may include, for example, PVDF (polyvinylidene fluoride), PVDF:THF (PVDF:tetrahydrofuran), PVDF:CTFE (PVDF:chlorotrifluoroethylene) PAN (polyacrylonitrile), and PEO (polyethylene oxide).

Figure 5:
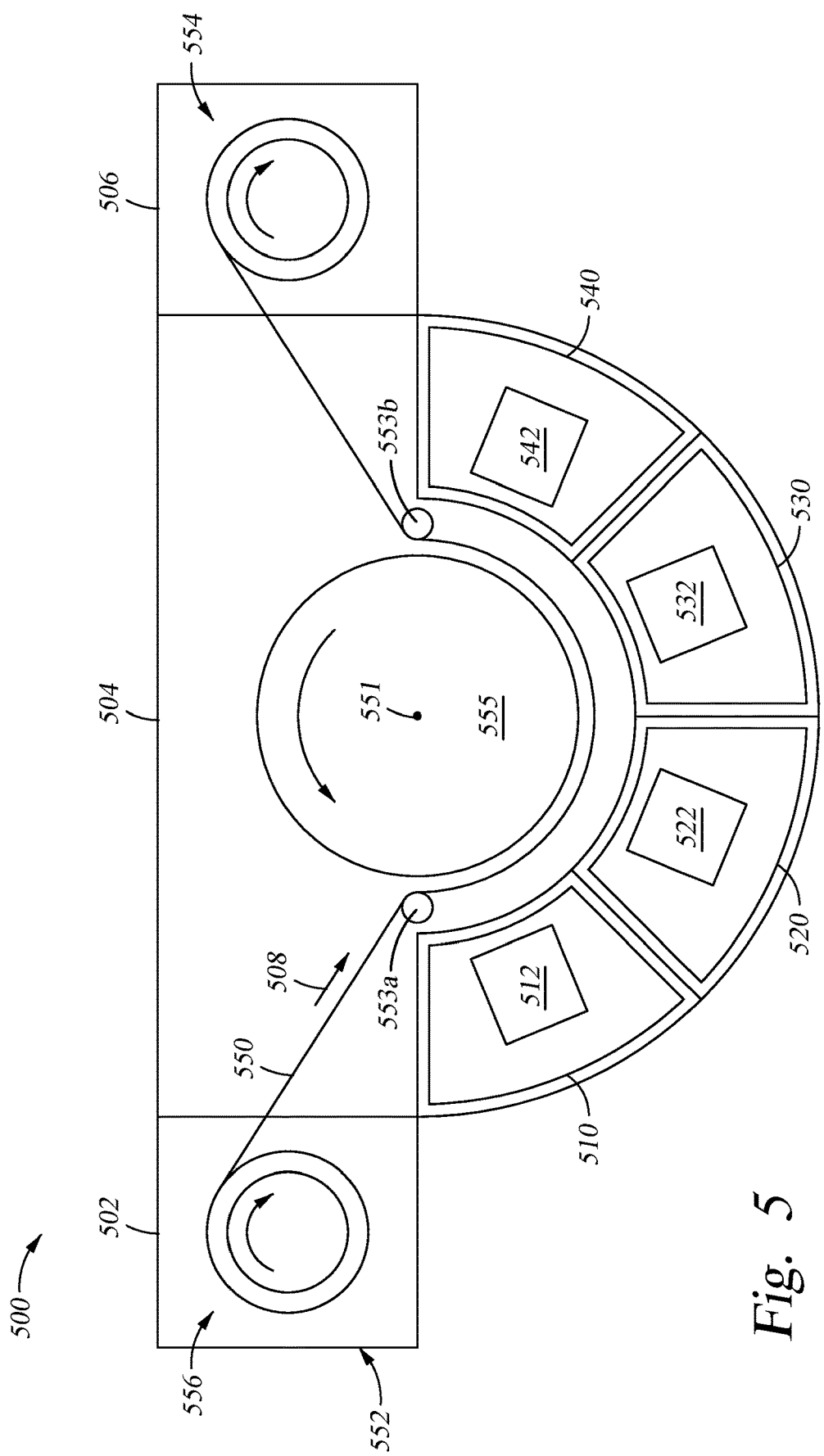
FIG. 5 illustrates a schematic view of an integrated processing tool operable to form an electrode structure according to implementations described herein.

FIG. 5 illustrates a schematic view of a flexible substrate coating apparatus 500 for forming an anode electrode structure according to implementations described herein. According to typical implementations, the flexible substrate coating apparatus 500 can be used for manufacturing anode electrode structures, and particularly for forming a diffusion barrier layer structure on a copper substrate. The flexible substrate coating apparatus 500 is constituted as a roll-to-roll system including an unwinding module 502, a processing module 504 and a winding module 506. In certain implementations, the processing module 504 comprises a plurality of processing modules or chambers 510, 520, 530 and 540 arranged in sequence, each configured to perform one processing operation to a continuous sheet of material 550 or web of material. In one implementation, as depicted in FIG. 5, the processing chambers 510-540 are radially disposed about a coating drum 555. Other arrangements besides radial are contemplated. For example, in another implementation, the processing chambers may be positioned in a linear configuration.

In one implementation, the processing chambers 510-540 are stand-alone modular processing chambers wherein each modular processing chamber is structurally separated from the other modular processing chambers. Therefore, each of the stand-alone modular processing chambers, can be arranged, rearranged, replaced, or maintained independently without affecting each other. Although four processing chambers 510-540 are shown, it should be understood that any number of processing chambers may be included in the flexible substrate coating apparatus 500.

The processing chambers 510-540 may include any suitable structure, configuration, arrangement, and/or components that enable the flexible substrate coating apparatus 500 to deposit a lithium anode device according to implementations of the present disclosure. For example, but not limited to, the processing chambers may include suitable deposition systems including coating sources, power sources, individual pressure controls, deposition control systems, and temperature control. In some implementations, the chambers are provided with individual gas supplies. The chambers are typically separated from each other for providing a good gas separation. The flexible substrate coating apparatus 500 according to implementations described herein is not limited in the number of deposition chambers. For example, but not limited to, the flexible substrate coating apparatus 500 may include 3, 6, or 12 processing chambers.

The processing chambers 510-540 typically include one or more deposition units 512, 522, 532, and 542. Generally, the one or more deposition units as described herein can be selected from the group of a CVD source, a PECVD source and a PVD source. The one or more deposition units can include an evaporation source, a sputter source, such as, a magnetron sputter source, DC sputter source, AC sputter source, pulsed sputter source, radio frequency (RF) sputtering, or middle frequency (MF) sputtering can be provided. For instance, MF sputtering with frequencies in the range of 5 kHz to 100 kHz, for example, 30 kHz to 50 kHz, can be provided. The one or more deposition units can include an evaporation source. In one implementation, the evaporation source is a thermal evaporation source or an electron beam evaporation. In one implementation, the evaporation source is a lithium (Li) source. Further, the evaporation source may also be an alloy of two or more metals. The material to be deposited (e.g., lithium) can be provided in a crucible. The lithium can be evaporated, for example, by thermal evaporation techniques, electron beam evaporation techniques, or lamination techniques.

In some implementations, any of the processing chambers 510-540 of the flexible substrate coating apparatus 500 may be configured for performing deposition by sputtering, such as magnetron sputtering. As used herein, "magnetron sputtering" refers to sputtering performed using a magnet assembly, that is, a unit capable of a generating a magnetic field. Typically, such a magnet assembly includes a permanent magnet. This permanent magnet is typically arranged within a rotatable target or coupled to a planar target in a manner such that the free electrons are trapped within the generated magnetic field generated below the rotatable target surface. Such a magnet assembly may also be arranged coupled to a planar cathode.

Magnetron sputtering may also be realized by a double magnetron cathode, such as, but not limited to, a Twin-Mag™ cathode assembly. In some implementations, the cathodes in the processing chamber may be interchangeable. Thereby, a modular design of the apparatus is provided which facilitates optimizing the apparatus for particular manufacture requirements. In some implementations, the number of cathodes in a chamber for sputtering deposition is chosen for optimizing an optimal productivity of the flexible substrate coating apparatus 500.

In some implementations, one or some of the processing chambers 510-540 may be configured for performing sputtering without a magnetron assembly. In some implementations, one or some of the chambers may be configured for performing deposition by other methods, such as, but not limited to, chemical vapor deposition, atomic laser deposition or pulsed laser deposition. In some implementations, one or some of the chambers may be configured for performing a plasma treatment process, such as a plasma oxidation or plasma nitridation process.

In certain implementations, the processing chambers 510-540 are configured to process both sides of the continuous sheet of material 550. Although the flexible substrate coating apparatus 500 is configured to process a horizontally oriented continuous sheet of material 550, the flexible substrate coating apparatus 500 may be configured to process substrates positioned in different orientations, for example, a vertically oriented continuous sheet of material 550. In certain implementations, the continuous sheet of material 550 is a flexible conductive substrate. In certain implementations, the continuous sheet of material 550 includes a conductive substrate with one or more layers formed thereon. In certain implementations, the conductive substrate is a copper substrate, such as the copper substrate 310 shown in FIGS. 3A-3D.

In certain implementations, the flexible substrate coating apparatus 500 comprises a transfer mechanism 552. The transfer mechanism 552 may comprise any transfer mechanism capable of moving the continuous sheet of material 550 through the processing region of the processing chambers 510-540. The transfer mechanism 552 may comprise a common transport architecture. The common transport architecture may comprise a roll-to-roll system with a common take-up-reel 554 positioned in the winding module 506, the coating drum 555 positioned in the processing module 504, and a feed reel 556 positioned in the unwinding module 502. The take-up reel 554, the coating drum 555, and the feed reel 556 may be individually heated. The take-up reel 554, the coating drum 555 and the feed reel 556 may be individually heated using an internal heat source positioned within each reel or an external heat source. The common transport architecture may further comprise one or more auxiliary transfer reels 553a, 553b positioned between the take-up reel 554, the coating drum 555, and the feed reel 556. Although the flexible substrate coating apparatus 500 is depicted as having a single processing region, in certain implementations, it may be advantageous to have separated or discrete processing regions for each individual processing chamber 510-540. For implementations having discrete processing regions, modules, or chambers, the common transport architecture may be a roll-to-roll system where each chamber or processing region has an individual take-up-reel and feed reel and one or more optional intermediate transfer reels positioned between the take-up reel and the feed reel.

The flexible substrate coating apparatus 500 may comprise the feed reel 556 and the take-up reel 554 for moving the continuous sheet of material 550 through the different processing chambers 510-540. In one implementation, the first processing chamber 510 is configured to deposit a first diffusion barrier film. The second processing chamber 520 is configured to deposit a second diffusion barrier film. The third processing chamber 530 is configured to deposit a wetting film. The fourth processing chamber 540 is configured to deposit a lithium metal film. In another implementation where the continuous sheet of material 550 is a polymer material, the first processing chamber 510 is configured to deposit a copper film on the polymer material. The second processing chamber 520 and the third processing chamber 530 are each configured to deposit a diffusion barrier film or a wetting film. The fourth processing chamber 540 is configured to deposit a lithium metal film. In some implementations, the finished anode electrode will not be collected on take-up reel 554 as shown in the figures, but may go directly for integration with the separator and cathode electrodes, etc., to form battery cells.

In one implementation, the first processing chamber 510 is configured for depositing a first diffusion barrier layer. In one implementation, the first diffusion barrier layer is a tantalum layer deposited by a PVD sputtering process using a tantalum target. In another implementation, the first diffusion barrier layer is a tantalum nitride layer deposited by a PVD sputtering process using a tantalum target in a nitrogen-containing environment or using a tantalum nitride target.

In one implementation, the second processing chamber 520 is configured for depositing a second diffusion barrier layer. In one implementation, the second diffusion barrier layer is a titanium layer deposited by a PVD sputtering process using a titanium target. In another implementation, the second diffusion barrier layer is a titanium nitride layer deposited by a PVD sputtering process using a titanium target in a nitrogen-containing environment or using a titanium nitride target.

In one implementation, the third processing chamber 530 is configured for depositing a wetting layer on the underlying barrier layer. In one implementation, the wetting layer is a silicon layer deposited by a PVD sputtering process using a silicon target.

In one implementation, the fourth processing chamber 540 is configured for depositing a thin film of lithium metal on the underlying layers. Any suitable lithium deposition process for depositing thin films of lithium metal may be used to deposit the thin film of lithium metal. Deposition of the thin film of lithium metal may be by PVD processes, such as evaporation, a slot-die process, a transfer process, a lamination process or a three-dimensional lithium printing process. The chambers for depositing the thin film of lithium metal may include a PVD system, such as an electron-beam evaporator, a thin film transfer system (including large area pattern printing systems such as gravure printing systems), a lamination system, or a slot-die deposition system.

In operation, the continuous sheet of material 550 is unwound from the feed reel 556 as indicated by the substrate movement direction shown by arrow 508. The continuous sheet of material 550 may be guided via one or more auxiliary transfer reels 553a, 553b. It is also possible that continuous sheet of material 550 is guided by one or more substrate guide control units (not shown) that shall control the proper run of the flexible substrate, for instance, by fine adjusting the orientation of the flexible substrate.

After uncoiling from the feed reel 556 and running over the auxiliary transfer reel 553a, the continuous sheet of material 550 is then moved through the deposition areas provided at the coating drum 555 and corresponding to positions of the deposition units 512, 522, 532, and 542. During operation, the coating drum 555 rotates around axis 551 such that the flexible substrate moves in the direction of arrow 508.

Implementations:

Clause 1. An anode electrode structure, comprising: a copper foil; a first diffusion barrier layer formed on the copper foil, wherein the first diffusion barrier layer comprises titanium (Ti), molybdenum (Mo), tungsten (W), zirconium (Zr), hafnium (Hf), niobium (Nb), tantalum (Ta), or combinations thereof; a wetting layer formed on the first diffusion barrier layer, wherein the wetting layer is selected from silicon (Si), tin (Sn), aluminum (Al), germanium (Ge), antimony (Sb), lead (Pb), bismuth (Bi), gallium (Ga), indium (In), zinc (Zn), cadmium (Cd), magnesium (Mg), oxides thereof, nitrides thereof, or combinations thereof; and a lithium metal layer formed on the wetting layer.

Clause 2. The anode electrode structure of clause 1, further comprising: a second diffusion barrier layer formed between the first diffusion barrier layer and the wetting layer, wherein the second diffusion barrier layer is different from the first diffusion barrier layer.

Clause 3. The anode electrode structure of clause 2, wherein the second diffusion barrier layer comprises titanium (Ti), molybdenum (Mo), tungsten (W), zirconium (Zr), hafnium (Hf), niobium (Nb), tantalum (Ta), or combinations thereof.

Clause 4. The anode electrode structure of clause 2 or 3, wherein the first diffusion barrier layer is a tantalum layer and the second diffusion barrier layer is a titanium layer.

Clause 5. The anode electrode structure of clause 2 or 3, wherein the first diffusion barrier layer is a tantalum nitride layer and the second diffusion barrier layer is a titanium layer.

Clause 6. The anode electrode structure of any of clauses 1 to 5, wherein the lithium metal layer forms an alloy with the wetting layer.

Clause 7. The anode electrode structure of any of clauses 1 to 6, wherein the first diffusion barrier layer has a thickness from about 100 nanometers to about 200 nanometers.

Clause 8. The anode electrode structure of any of clauses 1 to 7, wherein the wetting layer has a thickness from about 5 nanometers to about 20 nanometers.

Clause 9. A battery incorporating the anode electrode structure of any of clauses 1 to 8.

Clause 10. A method of forming an electrode structure, comprising: forming a first diffusion barrier layer on a copper foil, wherein the first diffusion barrier layer comprises titanium (Ti), molybdenum (Mo), tungsten (W), zirconium (Zr), hafnium (Hf), niobium (Nb), tantalum (Ta), or combinations thereof; forming a wetting layer on the first diffusion barrier layer, wherein the wetting layer is selected from silicon (Si), tin (Sn), aluminum (Al), germanium (Ge), antimony (Sb), lead (Pb), bismuth (Bi), gallium (Ga), indium (In), zinc (Zn), cadmium (Cd), magnesium (Mg), oxides thereof, nitrides thereof, or combinations thereof; and forming a lithium metal layer on the wetting layer.

Clause 11. The method of clause 10, further comprising: forming a second diffusion barrier layer on the first diffusion barrier layer prior to forming the wetting layer, wherein the second diffusion barrier layer is different from the first diffusion barrier layer.

Clause 12. The method of clause 11, wherein the second diffusion barrier layer comprises titanium (Ti), molybdenum (Mo), tungsten (W), zirconium (Zr), hafnium (Hf), niobium (Nb), tantalum (Ta), or combinations thereof.

Clause 13. The method of any of clauses 10 to 12, wherein the first diffusion barrier layer is a tantalum layer deposited by a PVD sputtering process using a tantalum target.

Clause 14. The method of any of clauses 10 to 13, wherein the first diffusion barrier layer is a tantalum nitride layer deposited by a PVD sputtering process using a tantalum target in a nitrogen-containing environment.

Clause 15. The method of any of clauses 11 to 14, wherein the second diffusion barrier layer is a titanium layer deposited by a PVD sputtering process using a titanium target.

Clause 16. The method of any of clauses 11 to 14, wherein the second diffusion barrier layer is a titanium nitride layer deposited by a PVD sputtering process using a titanium target in a nitrogen-containing environment.

Clause 17. The method of any of clauses 10 to 16, wherein the wetting layer is a silicon layer deposited by a PVD sputtering process using a silicon target.

Clause 18. The method of any of clauses 10 to 17, further comprising guiding the copper foil in a vacuum chamber using a roller arrangement.

Clause 19. An integrated processing tool operable to form lithium coated electrodes, comprising: a reel-to-reel system operable to transport a continuous sheet of material through following processing chambers: a first processing chamber operable to deposit a first diffusion barrier layer on the continuous sheet of material; a second processing chamber operable to deposit a second diffusion barrier layer on the first diffusion barrier layer; a third processing chamber operable to deposit a wetting layer on the second diffusion barrier layer; and a fourth processing chamber operable to deposit a thin film of lithium metal on the second diffusion barrier layer.

Clause 20. The integrated processing tool of clause 19, wherein the continuous sheet of material is a copper foil.

In summary, some of the benefits of the present disclosure include the use of refractory metal/metal nitride barrier films to ensure the temporal/thermal stability of the lithium metal/copper foil interface. As a result, the lithium metal/copper foil interface does not suffer degradation during operation as anodes in lithium metal batteries. In addition, the barrier films described herein help prevent the lithium induced embrittlement of copper foils, preserve mechanical properties of the copper foil as well as minimizing tearing of the copper foil. Thus, the barrier films described herein facilitate copper foil roll-to-roll handling.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:

1. An anode electrode structure, comprising:
   a copper foil;
   a first diffusion barrier layer formed on the copper foil, wherein the first diffusion barrier layer comprises titanium (Ti), molybdenum (Mo), tungsten (W), zirconium (Zr), hafnium (Hf), niobium (Nb), tantalum (Ta), or combinations thereof;
   a wetting layer formed on the first diffusion barrier layer, wherein the wetting layer is selected from silicon (Si), tin (Sn), aluminum (Al), germanium (Ge), antimony (Sb), lead (Pb), bismuth (Bi), gallium (Ga), indium (In), zinc (Zn), cadmium (Cd), magnesium (Mg), oxides thereof, nitrides thereof, or combinations thereof; and
   a lithium metal layer formed on the wetting layer.

2. The anode electrode structure of claim 1, further comprising:
   a second diffusion barrier layer formed between the first diffusion barrier layer and the wetting layer, wherein the second diffusion barrier layer is different from the first diffusion barrier layer.

3. The anode electrode structure of claim 2, wherein the second diffusion barrier layer comprises titanium (Ti), molybdenum (Mo), tungsten (W), zirconium (Zr), hafnium (Hf), niobium (Nb), tantalum (Ta), or combinations thereof.

4. The anode electrode structure of claim 3, wherein the first diffusion barrier layer is a tantalum layer and the second diffusion barrier layer is a titanium layer.

5. The anode electrode structure of claim 3, wherein the first diffusion barrier layer is a tantalum nitride layer and the second diffusion barrier layer is a titanium layer.

6. The anode electrode structure of claim 1, wherein the lithium metal layer forms an alloy with the wetting layer.

7. The anode electrode structure of claim 1, wherein the first diffusion barrier layer has a thickness from about 100 nanometers to about 200 nanometers.

8. The anode electrode structure of claim 7, wherein the wetting layer has a thickness from about 5 nanometers to about 20 nanometers.

9. A battery incorporating the anode electrode structure of claim 1.

10. A method of forming an electrode structure, comprising:
    forming a first diffusion barrier layer on a copper foil, wherein the first diffusion barrier layer comprises titanium (Ti), molybdenum (Mo), tungsten (W), zirconium (Zr), hafnium (Hf), niobium (Nb), tantalum (Ta), or combinations thereof;
    forming a wetting layer on the first diffusion barrier layer, wherein the wetting layer is selected from silicon (Si), tin (Sn), aluminum (Al), germanium (Ge), antimony (Sb), lead (Pb), bismuth (Bi), gallium (Ga), indium (In), zinc (Zn), cadmium (Cd), magnesium (Mg), oxides thereof, nitrides thereof, or combinations thereof; and forming a lithium metal layer on the wetting layer.

11. The method of claim 10, further comprising:

forming a second diffusion barrier layer on the first diffusion barrier layer prior to forming the wetting layer, wherein the second diffusion barrier layer is different from the first diffusion barrier layer.

12. The method of claim 11, wherein the second diffusion barrier layer comprises titanium (Ti), molybdenum (Mo), tungsten (W), zirconium (Zr), hafnium (Hf), niobium (Nb), tantalum (Ta), or combinations thereof.

13. The method of claim 10, wherein the first diffusion barrier layer is a tantalum layer deposited by a PVD sputtering process using a tantalum target.

14. The method of claim 10, wherein the first diffusion barrier layer is a tantalum nitride layer deposited by a PVD sputtering process using a tantalum target in a nitrogen-containing environment.

15. The method of claim 11, wherein the second diffusion barrier layer is a titanium layer deposited by a PVD sputtering process using a titanium target.

16. The method of claim 11, wherein the second diffusion barrier layer is a titanium nitride layer deposited by a PVD sputtering process using a titanium target in a nitrogen-containing environment.

17. The method of claim 10, wherein the wetting layer is a silicon layer deposited by a PVD sputtering process using a silicon target.

18. The method of any of claim 10, further comprising:

guiding the copper foil in a vacuum chamber using a roller arrangement.

19. An integrated processing tool operable to form lithium coated electrodes, comprising:

a reel-to-reel system operable to transport a continuous sheet of material through following processing chambers:

a first processing chamber operable to deposit a first diffusion barrier layer on the continuous sheet of material;

a second processing chamber operable to deposit a second diffusion barrier layer on the first diffusion barrier layer;

a third processing chamber operable to deposit a wetting layer on the second diffusion barrier layer; and a fourth processing chamber operable to deposit a thin film of lithium metal on the second diffusion barrier layer.

20. The integrated processing tool of claim 19, wherein the continuous sheet of material is a copper foil.

* * * * *